(12) United States Patent
Galloway et al.

(10) Patent No.: US 7,788,614 B1
(45) Date of Patent: Aug. 31, 2010

(54) METHOD AND APPARATUS FOR PERFORMING ANALYTIC PLACEMENT TECHNIQUES ON LOGIC DEVICES WITH RESTRICTIVE AREAS

(75) Inventors: David Galloway, Toronto (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 274 days.

(21) Appl. No.: 11/899,127

(22) Filed: Sep. 4, 2007

(51) Int. Cl.
G06F 17/50 (2006.01)

(52) U.S. Cl. ............................. 716/5; 716/6

(58) Field of Classification Search ................. 716/4–6
See application file for complete search history.

(56) References Cited

U.S. PATENT DOCUMENTS

| | | | |
|---|---|---|---|
| 6,952,816 B2 | 10/2005 | Gupta et al. | |
| 6,988,253 B1 | 1/2006 | Lipton et al. | |
| 7,266,796 B1 * | 9/2007 | Chu et al. | 716/9 |

OTHER PUBLICATIONS

J. Barnes, P. Hut, "A Hierarchical O(N log N) force-calculation algorithm", Nature, 324:446-449, 1986.

Georg Sigl, Konrad Doll, Frank M. Johannes, "Analytical Placment: A Linear or a Quadratic Objetive Function?", Design Automation Conference (DAC 1991).

Jens Vygen, "Algorithms for Large-Scale Flat Placement", Design Automation Conference (DAC 1997).

Hans Eisenmann and Frank M. Johannes, "Generic Global Placement and Floorplanning", Design Automation Conference (DAC 1998).

Natarajan Viswanathan, Chris Chong-Nuen Chu, "FastPlace: Efficient Analytical Placement Using Cell Shifting, Iterative Local Refinement and a Hybrid Net Model", International Symposium on Physical Design (ISPD 2004), ACM.

Tao Luo, Haoxing Ren, Charles J. Alpert, and David Z. Pan, "Computational Geometry Based Placement Migration", International Conference on Computer-Aided Design (ICCAD 2005).

* cited by examiner

*Primary Examiner*—Jack Chiang
*Assistant Examiner*—Binh C Tat
(74) *Attorney, Agent, or Firm*—L. Cho

(57) ABSTRACT

A method for designing a system on a target device having restricted areas includes determining locations on the target device for all cells in the system by solving one or more equations. The one or more equations are modified, or supplemented by adding one or more additional equations, by applying spreading forces to the cells that take into consideration classification types of the cells and restricted areas on the target device that do not support the classification types. Revised locations on the target device are determined for the cells by solving the modified one or more equations.

34 Claims, 14 Drawing Sheets

METHOD AND APPARATUS FOR PERFORMING ANALYTIC PLACEMENT TECHNIQUES ON LOGIC DEVICES WITH RESTRICTIVE AREAS

TECHNICAL FIELD

Embodiments of the present invention relate to tools such as electronic design automation (EDA) tools for designing systems on field programmable gate arrays (FPGAs) and structured application specific integrated circuits (ASICs). More specifically, embodiments of the present invention relate to a method and apparatus for performing analytic placement techniques on logic devices with restrictive areas using EDA tools.

BACKGROUND

Logic devices such as FPGAs and structured ASICs are used to implement large systems that include million of gates and megabits of embedded memory. The complexity of large systems often requires the use of EDA tools to create and optimize a design for the system onto physical target devices. Among the procedures performed by EDA tools in a computer aided design (CAD) flow are synthesis, mapping, placement, and routing.

Iterative improvement is one technique that may be used for performing placement by EDA tools. Iterative improvement generates an initial placement solution and evolves the placement by making changes to a subset of the solutions. Simulated annealing is one of several iterative improvement algorithms that are commonly used. Analytic placement is a technique that is more commonly used for performing placement on ASICs. Analytic placement establishes a formula that can be used to compute the cost for a potential placement. The formula may include one or more equations. The formula may take into account cost components such as the amount of wire needed to connect together cells such as a logic-array block, register, memory, or other component, the speed of the resulting design, the amount of power used, or other criteria. Cells may be assigned to the locations on the ASIC by considering solutions which maximize or minimize an objective. Quadratic placement is one of several analytic placement algorithms that are commonly used.

Analytic placement techniques are faster than iterative improvement techniques, but their applications traditionally have been limited to ASICs since analytic placement techniques have significant trouble with restricted areas on FPGAs and structured ASICs. Modern FPGAs and structured ASICs have restricted areas where only certain classification of cells may be placed. For example, FPGAs and structured ASICs have pre-fabricated locations that can only be used to implement RAMs or multipliers and cannot be used for other elements such as logic-array blocks. These restrictive areas may be scattered across a device in a regular or irregular manner.

SUMMARY

According to an embodiment of the present invention, one or more equations used for analytic placement is modified to reflect restrictive areas on a target device that do not include resources to support certain classification types of cells. The one or more equations used for analytic placement may be modified differently for each classification type of cells to be placed. By taking into consideration classification types of cells and the restricted areas on the target device, embodiments of the present invention allow analytic placement techniques to be used to place cells such as logic-array blocks, registers, multipliers, IOs, and memories on FPGAs and structured ASICs.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
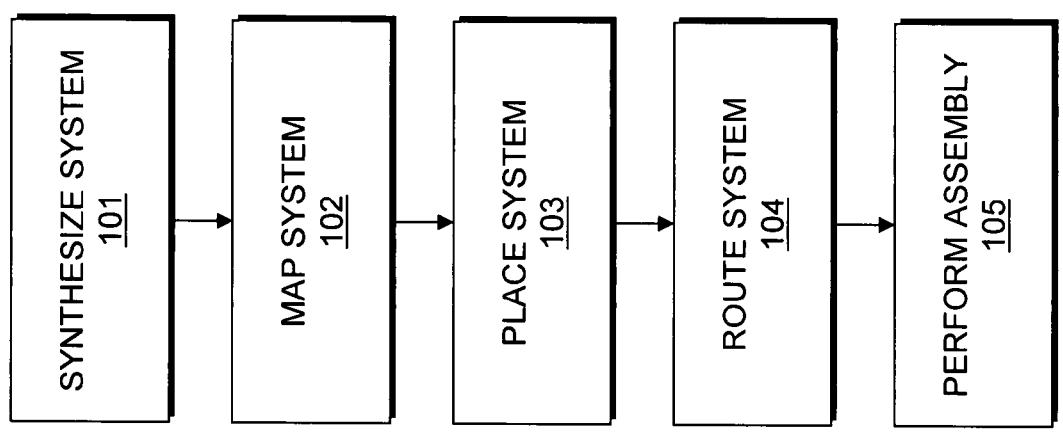
FIG. 1 is a flow chart illustrating a method for designing a system on a target device according to an exemplary embodiment of the present invention.

FIG. 1 is a flow chart illustrating a method for designing a system on a target device according to an embodiment of the present invention. The procedure shown in FIG. 1 may be performed by an EDA tool implemented on a computer system. At 101, the system is synthesized. Synthesis includes generating a logic design of the system to be implemented. The design of the system may be described at a gate level or in a more abstract level. The design of the system may be described in terms of a hardware description language (HDL) such as VHDL or Verilog. The target device may be a structured ASIC, FPGA, programmable logic device (PLD), or other target device. According to an embodiment of the present invention, synthesis generates an optimized logical representation of the system from a HDL design definition. The optimized logical representation of the system may include a representation that has a minimized number of functional blocks and registers, such as logic gates and logic elements, required for the system.

At 102, technology mapping is performed on the optimized logic design. Technology mapping includes determining how to implement logic gates and logic elements in the optimized logic representation with resources available on the target device. The resources available on the target device may be referred to as "cells" and may include logic-array blocks, registers, memories, digital signal processing blocks, input output elements, and other components. According to an embodiment of the present invention, a netlist is generated from mapping. This netlist may be an optimized technology-mapped netlist generated from the HDL.

At 103, the mapped logical system design is placed. Placement works on the optimized technology-mapped netlist to produce a placement for each of the functional blocks. According to an embodiment of the present invention for a target device that is a structured ASIC, placement includes fitting the system on the target device by determining which components on the logic design are to be used for specific logic elements, and other function blocks. According to an embodiment of the present invention, placement may be performed by applying one or more analytic placement techniques that establish one or more equations that may be used to compute a cost for a potential placement. The one or more equations may take into account cost components such as the amount of wire needed to connect together cells, the speed of the resulting design, the amount of power used, or other criteria. Solutions to a set of equations (that minimize or maximize an objective) may be used when assigning locations for the cells on the target device. According to an embodiment of the present invention, the one or more equations may reflect restrictive areas on the target device that do not support certain cells. In this embodiment, an equation used for analytic placement may be modified differently for each classification type of cells to be placed. By taking into consideration classification types of cells and the restricted areas on the target device, embodiments of the present invention allow analytic placement techniques to be used to effectively place cells such as logic-array blocks, registers, multipliers, IOs, and memories on target devices such as FPGAs and structured ASICs.

At 104, it is determined which routing resources should be used to connect the components in the logic design implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 106, an assembly procedure is performed. The assembly procedure involves creating a data file that includes information determined by the procedure described by 101-105. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
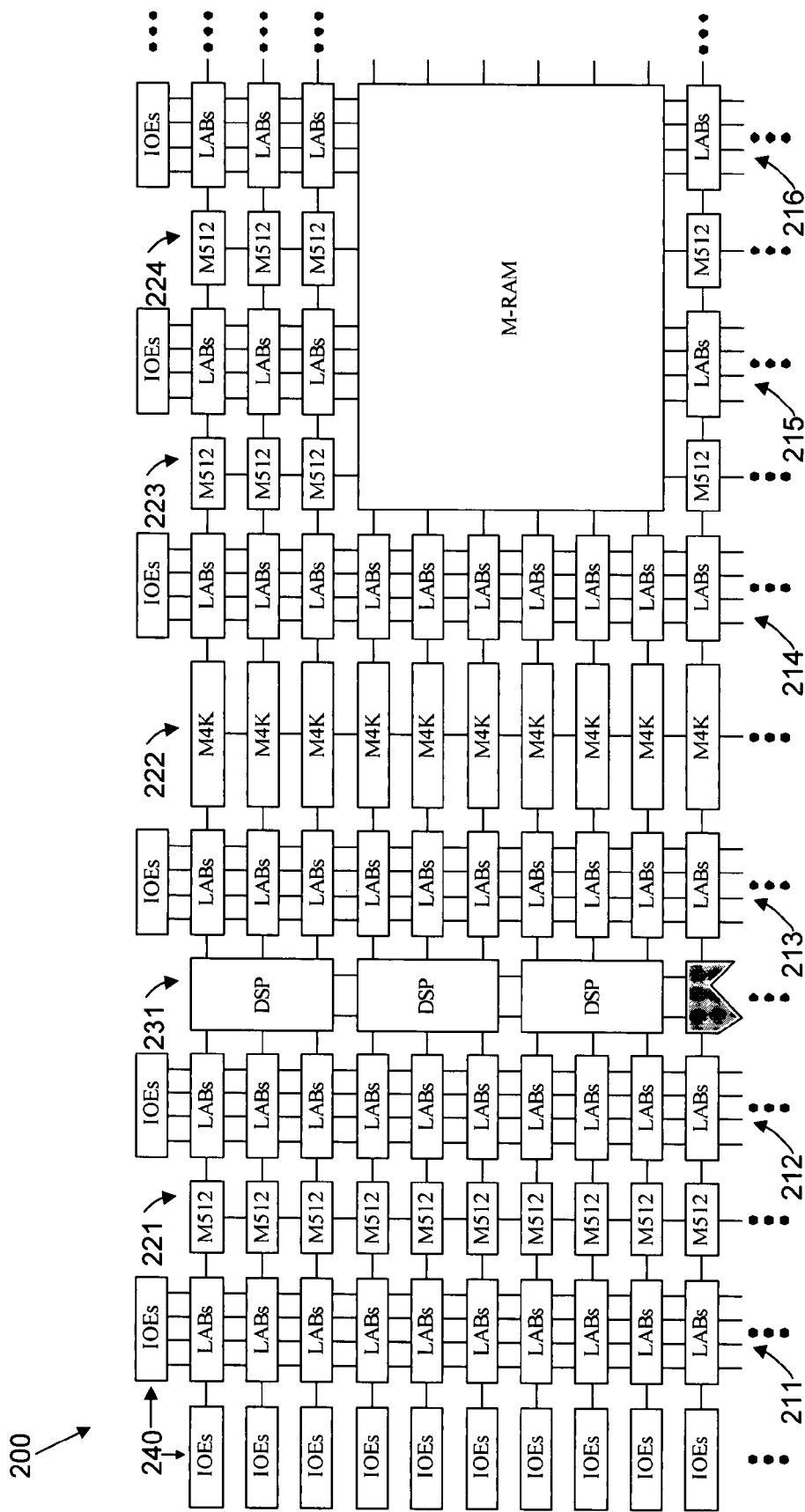
FIG. 2 illustrates an exemplary target device according to an exemplary embodiment of the present invention.

FIG. 2 illustrates an exemplary target device 200 in which a system may be implemented on 200 utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ manufactured by Altera® Corporation. LABs are grouped into rows and columns across the target device 200. Columns of LABs are shown as 211-216. It should be appreciated that the logic block may include additional or alternate components.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, Stratix™, Cyclone™, Stratix™ II, and Cyclone™ II families of chips and those employed by Xilinx® Inc. in its Virtex™ and Virtex™ II, and Virtex IV™ line of chips. According to an alternate embodiment of the present invention, the target device may be a structured ASIC. According to one embodiment, a structured ASIC is an integrated circuit with pre-defined blocks that is programmed by customizing a subset of the routing layers. Structured ASICs do not require all layers to be changed the way full custom or cell based ASICs do. Structured ASIC are sometime used to implement designs that are prototyped in FPGAs. The structured ASIC typically saves area and power relative to the FPGA design.

Figure 3:
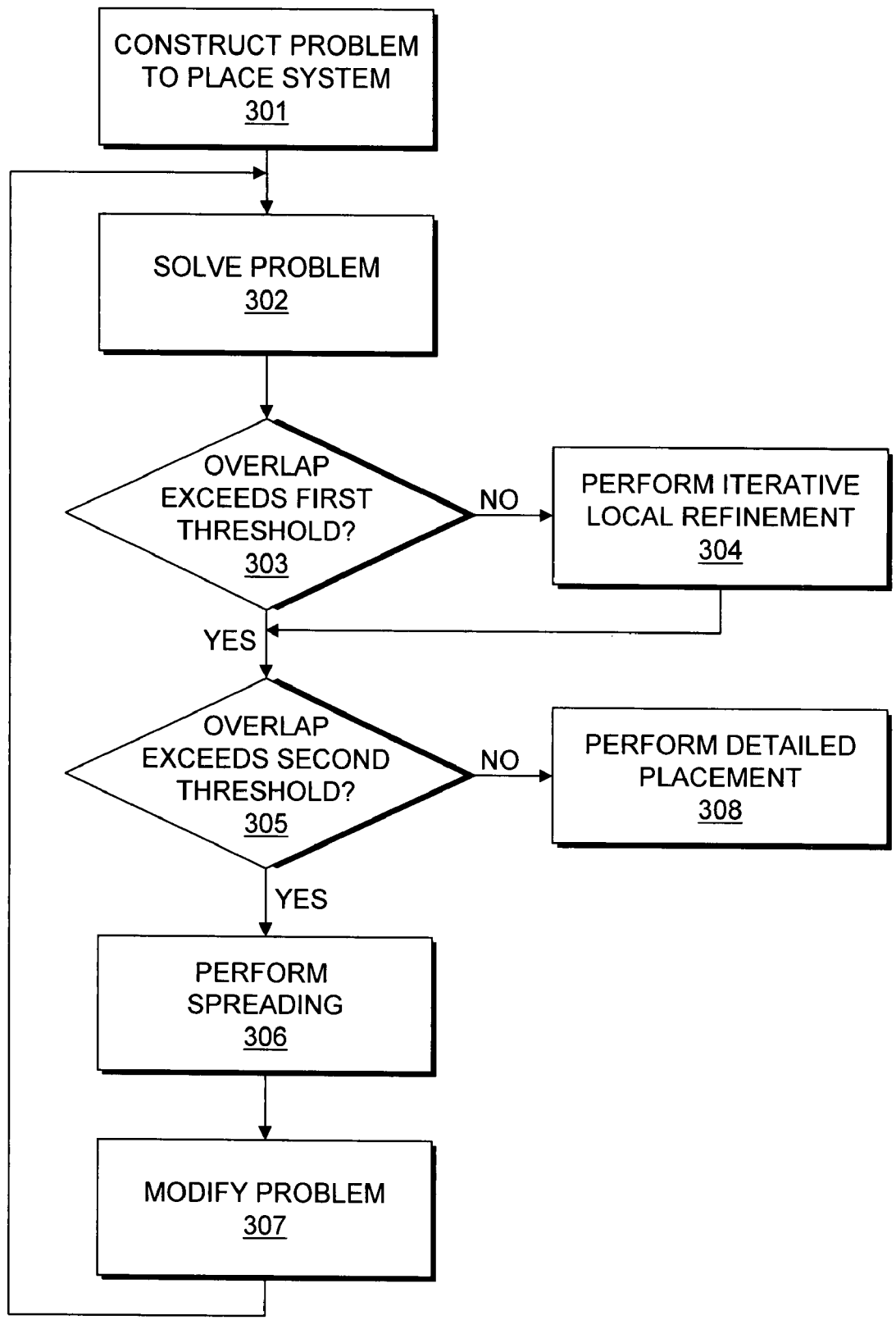
FIG. 3 is a flow chart illustrating a method for performing analytic placement according to an exemplary embodiment of the present invention.

FIG. 3 is a flow chart illustrating a method for performing analytic placement according to an exemplary embodiment of the present invention. The procedure illustrated in FIG. 3 may be used to implement procedure 103 shown in FIG. 1. At 301, a mathematical problem is constructed to describe the placement of cells onto a target device for a design of a system. The problem may include one or more equations. According to an embodiment of the present invention, the problem constructed is a quadratic minimization problem.

At 302, the problem is solved to yield placement solutions. The placement solutions provide locations on the target device for the cells.

At 303, it is determined whether the overlap of locations for the cells exceeds a first threshold level. If the overlap of locations for the cells does not exceed the first threshold level, control proceeds to 304. If the overlap of locations for the cells exceeds a first level, control proceeds to 305.

At 304, iterative local refinement is performed on the placement solutions. Iterative local refinement modifies the locations for the cells to improve the quality of the placement. According to an embodiment of the present invention, iterative local refinement modifies the locations for the cells to optimize objectives such as wire length required for connecting the cells, power, and circuit performance.

At 305, it is determined whether the overlap of locations for the cells exceeds a second threshold level. According to an embodiment of the present invention, the second threshold level is lower than the first threshold level. If the overlap of locations for the cells exceeds the second level, control proceeds to 306. If the overlap of locations for the cells does not exceed the second threshold level, control proceeds to 308.

At 306, spreading is performed on the cells to reduce the amount of overlap. According to an embodiment of the present invention, spreading includes generating spreading forces that direct the cells to new locations for at least some of the cells. The spreading forces take into consideration classification types of the cells and restricted areas on the target device that do not support the classification types.

At 307, the problem constructed to describe the placement of cells is modified to reflect the application of the spreading forces. According to an embodiment of the present invention, additional terms may be added to the problem formula to encourage cells to move towards areas that can support them and away from areas that cannot support them. The additional terms may be dependent on the classification type of the cell. Thus, a cell of classification type A would be encouraged to move towards areas that can support classification type A cells and cells of classification type B would be encouraged to move toward areas that support classification type B cells. Control returns to 302.

At 308, detailed placement and legalization is performed on the locations of the cells to generate a final placement solution for the cells.

Figure 4:
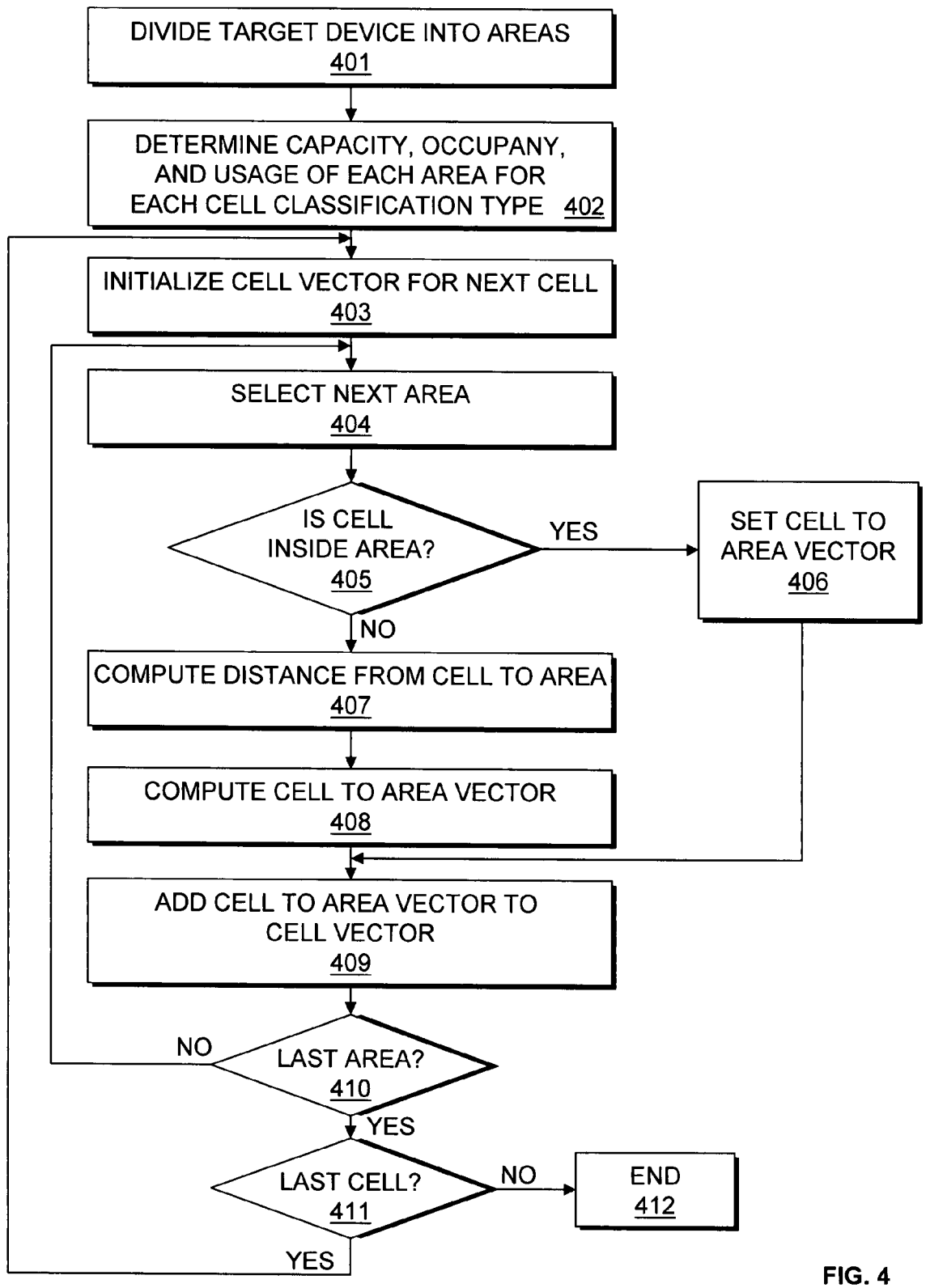
FIG. 4 is a flow chart illustrating a method for performing spreading according to a first embodiment of the present invention.

FIG. 4 is a flow chart illustrating a method for performing spreading according to a first embodiment of the present invention. The procedure illustrated in FIG. 4 may be used to implement procedure 306 in FIG. 3. At 401, a target device is divided into a plurality of areas. According to an embodiment of the present invention, the areas are of equal size. The areas may be of a size of a cell or larger.

At 402, the capacity, occupancy, and excess for each cell classification type (type of cell classification) are determined. The capacity for each cell classification type is the number of cells of a particular classification type that the area can support. The capacity value takes into account that an area may be a restrictive area for some cell classification types and may not include resources that support some cell classification types. The occupancy for each cell classification type is the number of cells of a particular classification type that currently reside in an area from current placement. The excess for each cell classification type is the ratio or difference of occupancy and capacity. According to an embodiment of the present invention, excess may be computed from subtracting capacity from occupancy.

At 403, a cell vector for a next cell to be processed is initialized. According to an embodiment of the present invention, vector for the cell is initialized to zero, (0,0).

At 404, a next area to be examined is selected.

At 405, it is determined whether the cell is inside the area. If the cell is inside the area, control proceeds to 406. If the cell is not inside the area, control proceeds to 407.

At 406, an area to cell vector is set to zero, (0,0). The magnitude of the area to cell vector is equal to a repulsion amount. The repulsion amount for the area is set to 0. According to an embodiment of the present invention, if a cell is in the area and the capacity of the area for this type of cell is zero, then the repulsion amount is set to 0. This is done to prevent cells from being pushed away from an overfilled placement area. Similarly, if the cell is in the area and the excess of this type of element is greater than zero, the repulsion amount may be set to 0. If the cell is in the area and the occupancy of the area of the classification type of the cell is less than or equal to the capacity of the area for the classification type of the cell, the repulsion amount is also 0. This may be done to prevent elements from being unnecessarily held in place.

At 407, a distance is computed between the cell as currently placed and the area. The distance may be measured from the cell to the center point of the area.

At 408, an area to cell vector is generated. The area to cell vector points to the cell from the position of the area and has a magnitude equal to a repulsion amount of the area. According to an embodiment of the present invention, the repulsion amount of the area is set to the occupancy of the classification type of the cell divided by the square of the distance as determined at 407. It should be appreciated that repulsion amount may be computed using other techniques. For example, the repulsion amount may be computed as the excess of the classification type of the cell in the area divided by the square of the distance. The repulsion amount may also be a sub-linear function of under-fill.

At 409, the area to cell vector is added to other area to cell vectors, if available, to generate a cell vector. The cell vector provides spreading forces to move the cells at their previously placed locations to new locations on the target device.

At 410, it is determined whether the current area is the last area to examine. If the current area is not the last area to examine, control returns to 404. If the current area is the last area to examine, the cell vector has been computed and control proceeds to 411. According to an embodiment of the present invention, the magnitude of the cell vector may be reduced if the cell is already in an appropriate location. For example, the cell may be placed in an area where excess of the classification type of the cell is less than or equal to zero.

At 411, it is determined whether the current cell is the last cell to be processed. If the current cell is not the last cell to process, control returns to 403. If the current cell is the last cell to process control proceeds to 412.

At 412, control terminates the process. According to an alternate embodiment of the present invention, approximate capacities, occupancies, excesses, and area to cell vectors are determined using quad trees. This would allow it to run with processor time proportional to $N*\log(N)$, instead of $N**2$. In other embodiments, the repulsion amounts may be computed using local information considering areas close to the cell. This may achieve linear run-time in the respective phases of the computation. This may also improve the quality of the placement solution by preventing large oscillations that arise when elements are attracted to large empty areas of the target device.

Figure 5:
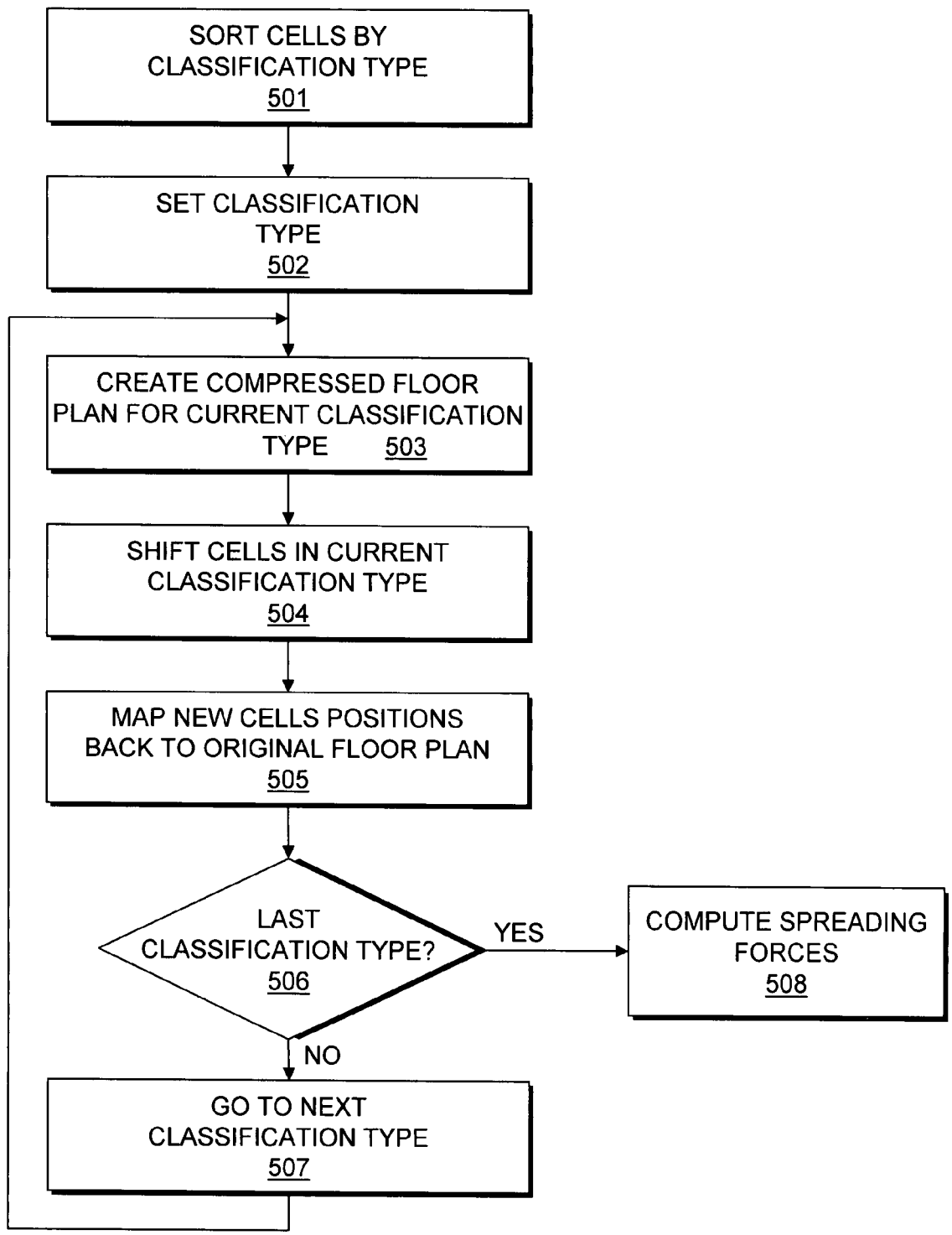
FIG. 5 is a flow chart illustrating a method for performing spreading according to a second embodiment of the present invention.

FIG. 5 is a flow chart illustrating a method for performing spreading according to a second embodiment of the present invention. The procedure illustrated in FIG. 5 may be utilized to implement procedure 306 in FIG. 3. At 501, cells in the design of the system are sorted by classification type. According to an embodiment of the present invention, the cell of a system may be classified as LABs, memories, registers, DSP blocks, IO elements, or other components.

At 502, a first classification type among the classification types is selected as the current classification type.

At 503, a compressed floor plan is created for the current classification type. According to an embodiment of the present invention, the compressed floor plan is a smaller version of the original floor plan for the target device. The compressed floor plan includes only areas that support the current classification type and omits areas that do not support the current classification type. Cells in the original floor plan of the target device are mapped to the compressed floor plan.

At 504, a shifting procedure is performed on the cells in the current classification type on the compressed floor plan. According to an embodiment of the present invention, the shifting procedure negotiates spreading of cells in order to reduce overlapping (excess). New locations for one or more cells are found.

At 505, the locations for the cells in the compressed floor plan are mapped back to the original floor plan for the target device.

At 506, it is determined whether the current classification type is the last classification type to be processed. If the current classification type is not the last classification type to be processed, control proceeds to 507. If the current classification type is the last classification type to be processed, control proceeds to 508.

At 507, a next classification type is selected as the current classification type. Control returns to 503.

At 508, spreading forces are computed to move the cells at their previously placed locations to the new locations determined at 505.

In situations where entire rows or columns of a target device cannot support a particular cell classification type, the procedure of creating a compressed floor plan which omits the rows or columns allows spreading between adjacent areas and avoids the problems associated with pushing excess cells from one area to an under-used area across intermediate areas that do not have resources to support those cells.

Figure 6:
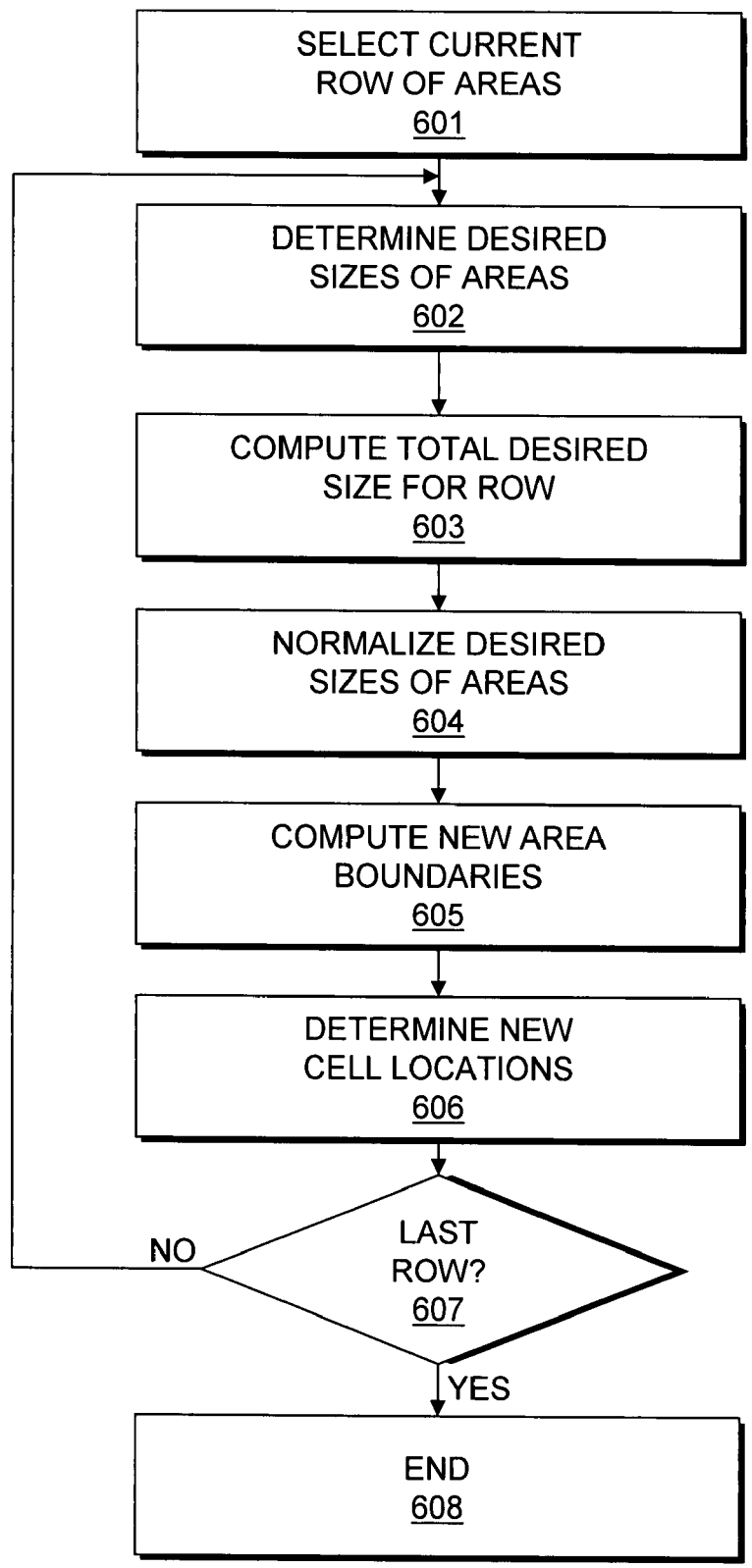
FIG. 6 is a flow chart illustrating a method for shifting cells according to a first embodiment of the present invention.
Figure 7:
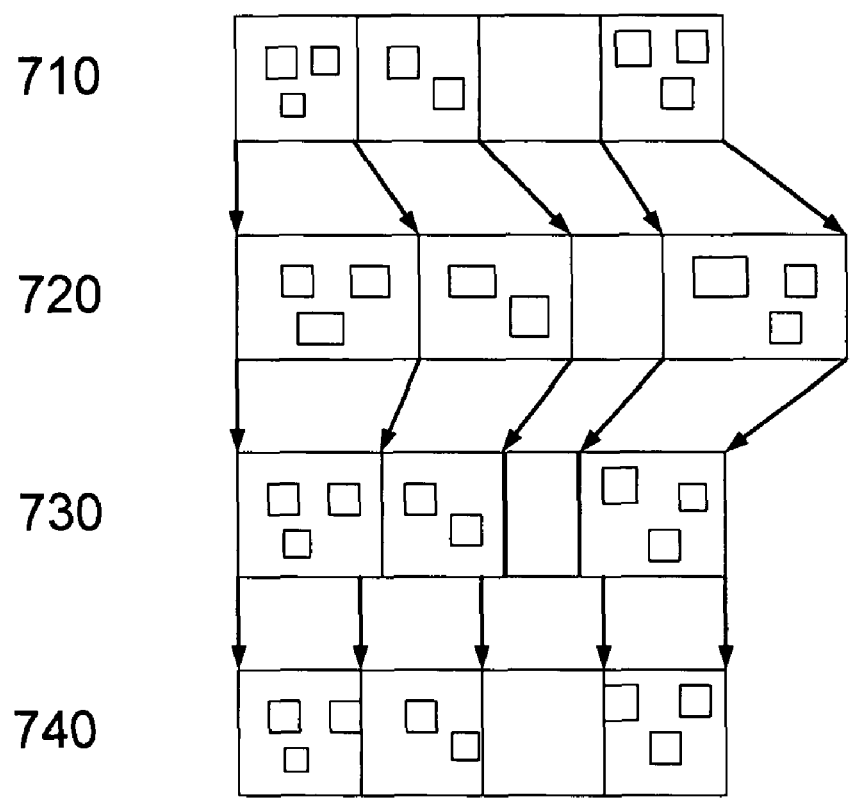
FIG. 7 is an example of performing the procedure illustrated in FIG. 6 on a row of areas.

FIG. 6 is a flow chart illustrating a method for shifting cells according to a first embodiment of the present invention. The procedure illustrated in FIG. 6 may be used to implement procedure 504 in FIG. 5. At 601, a current row of areas to be processed on a target device is selected. Typically this will be the first row available. FIG. 7 illustrates an example of how the procedure illustrated in FIG. 6 may be applied to a row of areas. Row 710 illustrates the original placement of cells on a row of four areas.

Referring back to FIG. 6, at 602, a desired size for each area in the row is determined. The desired size for each area is determined based on the capacity and occupancy of the areas. According to an embodiment of the present invention, if an area is under-utilized (excess value is less than 0), a smaller, non-zero desired size may be given to the area. If an area is over-utilized (excess value is greater than 0), a larger desired size may be given to the area. Row 720 in FIG. 7 illustrates the desired sizes determined for the row of four areas.

Referring back to FIG. 6, at 603, a total desired size for the entire row of areas is computed. This may be achieved by summing the desired size of the areas making up the row.

At 604, the desired size for each area is normalized. According to an embodiment of the present invention, the desired size for each area is multiplied with the original row width and divided by the total desired size for the entire row of areas.

At 605, new area boundaries are computed from the normalized desired sizes for the areas. According to an embodiment of the present invention, this may be achieved by computing a desired left edge position and a desired right edge position of each area by setting the desired left edge position of the left-most area to the left edge of the target device. The desired right edge position of each area is set to be the area's desired left edge position plus the area's normalized desired size. The desired left edge position of all areas (other than the left-most area) is set to be the desired right edge position corresponding to the area to the left. Row 730 in FIG. 7 illustrates the new boundaries computed for the row of four areas.

Referring back to FIG. 6, at 606, new cell locations are determined. According to an embodiment of the present invention, new cell locations may be determined for each cell based upon the cell's previous location, new area boundaries, and characteristics of the area corresponding to the cell as illustrated in the relationship below.

NormalizedDesiredElementLocation=NormalizedDesiredLeftEdgePositionOfArea+((ElementLocation−LeftEdgePositionOfArea)*NormalizedDesiredSizeOfArea/WidthOfArea)

Row 740 in FIG. 7 illustrates the new placement of the cells in the row of four areas. It should be appreciated that a new location determined for a cell may move the cell to a different area, a different location within the cell's original area, or be the same location in the cell's original area as originally placed.

Referring back to FIG. 6, at 607, it is determined whether the current row is the last row to be processed. If the current row is not the last row to be processed, control selects a next row to be the current row to process and returns to 602. If the current row is the last row to be processed, control proceeds to 608.

At 608, control terminates the procedure.

Figure 8:
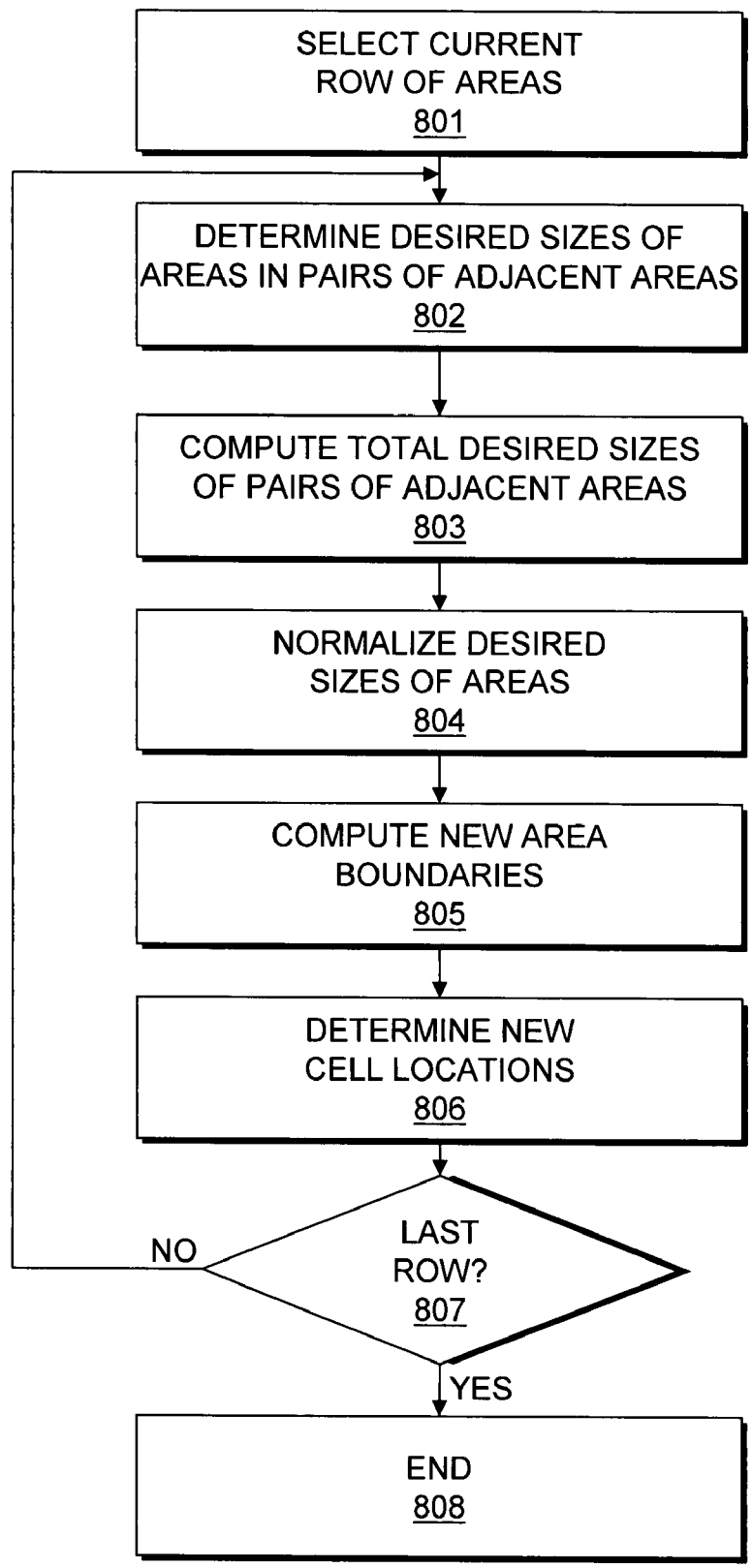
FIG. 8 is a flow chart illustrating a method for shifting cells according to a second embodiment of the present invention.

FIG. 8 is a flow chart illustrating a method for shifting cells according to a second embodiment of the present invention. The procedure illustrated in FIG. 8 may be used to implement procedure 504 in FIG. 5. At 801, a current row of areas to be processed on a target device is selected. Typically this will be the first row available.

At 802, desired sizes for areas in pairs of adjacent areas are determined. The desired size for each area is determined based on capacity and occupancy of the areas. According to an embodiment of the present invention, if an area is under-utilized (excess value is less than 0), a smaller, non-zero desired size may be given to the area. If an area is over-utilized (excess value is greater than 0), a larger desired size may be given to the area.

At 803, a total desired size is computed for each pair of adjacent areas.

At 804, the desired size for each area is normalized. According to an embodiment of the present invention, the desired size for each area is multiplied with the original pair width and divided by the total desired size for the pair.

At 805, new area boundaries are computed from the normalized desired sizes for the areas in each pair. According to an embodiment of the present invention, this may be achieved by computing a desired left edge position and a desired right edge position of each area in the pair by setting the desired left edge position of the left area to its original position on the target device. The desired right edge position of each area is set to be the area's desired left edge position plus the area's normalized desired size. The desired left edge position of the right area is set to be the desired right edge position corresponding to the left area.

At 806, new cell locations are determined. According to an embodiment of the present invention, new cell locations may be determined for each cell based upon the cell's previous location, new area boundaries, and characteristics of the area corresponding to the cell as illustrated in the relationship below.

NormalizedDesiredElementLocation=NormalizedDesiredLeftEdgePositionOfArea+((ElementLocation−LeftEdgePositionOfArea)*NormalizedDesiredSizeOfArea/WidthOfArea)

It should be appreciated that a new location determined for a cell may move the cell to an adjacent area, a different location within the cell's original area, or be the same location in the cell's original area as originally placed.

At 807, it is determined whether the current row is the last row to be processed. If the current row is not the last row to be processed, control selects a next row to be the current row to process and returns to 802. If the current row is the last row to be processed, control proceeds to 808.

At 808, control terminates the procedure.

FIGS. 7 and 8 describe processing areas in a row and adjacent pairs of areas in a row. It should be appreciated that the techniques described in FIGS. 7 and 8 may be applied to processing areas in a column, adjacent pairs of areas in a column, and areas in other configurations. It should be appreciated that the rows and columns of areas can be processed simultaneously. It should further be appreciated that the techniques described with reference to FIGS. 7 and 8 may be implemented either on a compressed floor plan or on an original or non-compressed floor plan.

Figure 9:
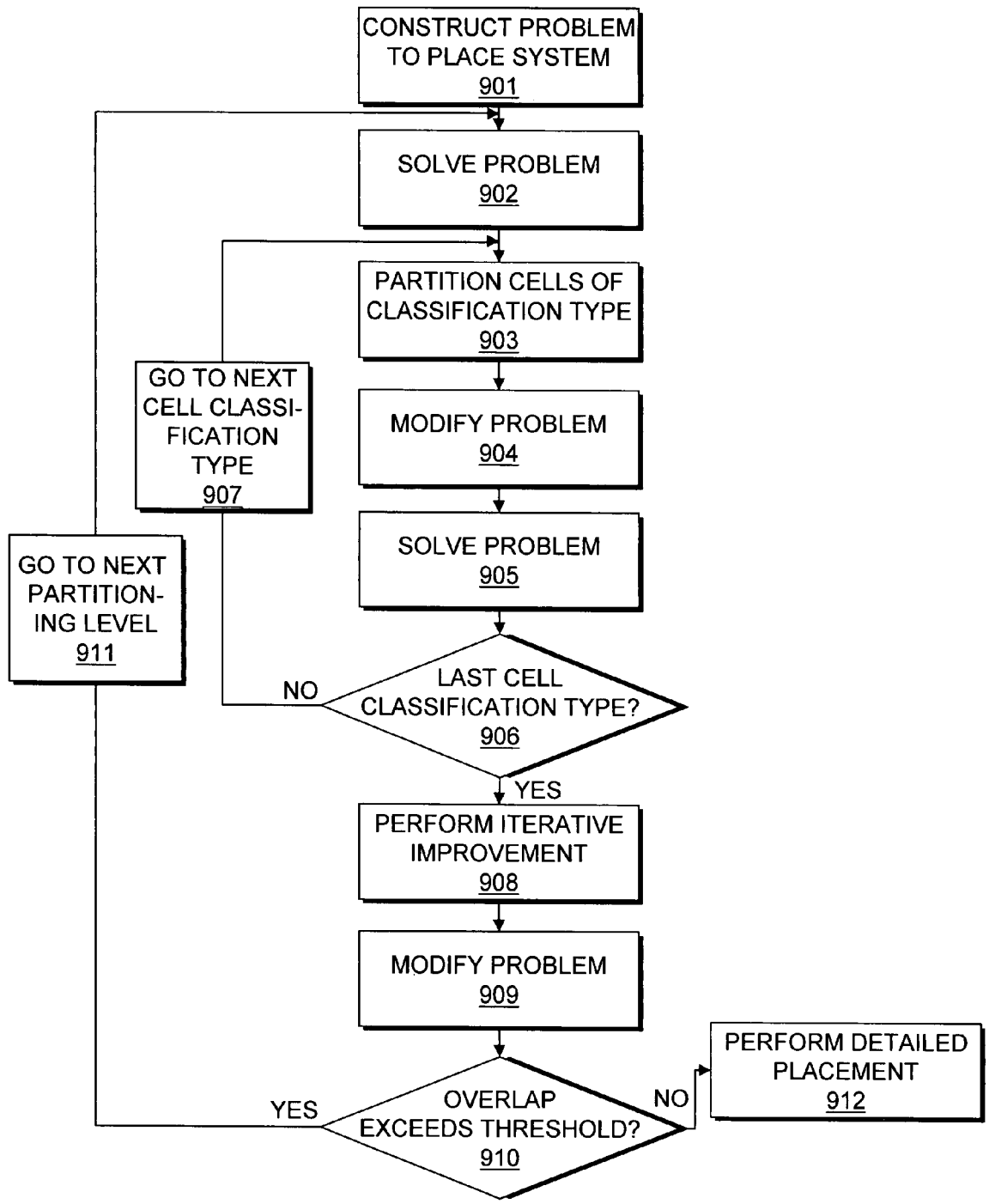
FIG. 9 is a flow chart illustrating a method for performing analytic placement with partitioning according to an embodiment of the present invention.

FIG. 9 is a flow chart illustrating a method for performing analytic placement with partitioning according to an embodiment of the present invention. The procedure illustrated in FIG. 9 may be used to implement procedure 103 shown in FIG. 1. At 901, a mathematical problem is constructed to describe the placement of cells onto a target device for a design of a system. The problem may include one or more equations. According to an embodiment of the present invention, the problem constructed is a quadratic minimization problem.

At 902, the problem is solved to yield placement solutions. The placement solutions provide locations on the target device for the cells.

At 903, partitioning is performed on cells of a specific classification type. According to an embodiment of the present invention, partitioning includes dividing the target device into areas (sizing areas or regions), determining new locations for cells of the classification type based upon the capacity and current occupancy of each area, and computing spreading forces to move the cells towards the new locations. According to an embodiment of the present invention, cells of a classification type that have a fewer number of placement options on the target device are partitioned before cells of a classification type having a greater number of placement options on the target device. According to an embodiment of the present invention, partitioning at a first partitioning level may involve dividing the target device into areas. Subsequent partitioning at a next partitioning level may involve dividing the earlier determined areas into sub-areas. Further partitioning into next partitioning levels may involve dividing the sub-areas into smaller sub-areas, and so on each time the procedure loops through 911 to 903.

At 904, the problem constructed to describe the placement of cells is modified to reflect the application of the spreading forces determined during partitioning. According to an embodiment of the present invention, additional terms may be added to the problem formulation to encourage cells to move towards areas that can support them and away from areas that cannot support them. The terms may be dependent on the classification type of the cell. Thus, a cell of classification type A would be encouraged to move towards areas that can support classification type A cells and cells of classification type B would be encouraged to move toward areas that support classification type B cells.

At 905, the modified problem is solved to yield placement solutions. The placement solutions provide locations on the target device for the cells.

At 906, it is determined whether all of the cell classification types have been partitioned at the current partition level. If not all of the cell classification types have been partitioned at the current partition level, control proceeds to 907. If all of the cell classification types have been partitioned at the current partition level, control proceeds to 908.

At 907, control is prepared to examine a next cell classification type that has not yet been partitioned at the current partition level. Control returns to 903.

At 908, iterative improvement is optionally performed on the placement solutions. Iterative improvement modifies the locations for the cells to improve the quality of the placement. According to an embodiment of the present invention, iterative improvement modifies the locations for the cells to reduce the wire length required for connecting the cells, optimizes timing, power consumption, and/or other characteristics of the design of the system.

At 909, the problem constructed to describe the placement of cells is further modified to incorporate decisions from iterative improvement.

At 910, it is determined whether the overlap of locations for the cells exceeds a threshold level. If the overlap of locations for the cells exceeds the threshold level, control proceeds to 911. If the overlap of locations for the cells does not exceed the threshold level, control proceeds to 912.

At 911, control is prepared to perform partitioning at a next partitioning level. According to an embodiment of the present invention, partitioning at a next partitioning level may involve further dividing areas determined at a previous partitioning level into sub-areas or further dividing sub-areas into smaller sub-areas. Control returns to 902 with the problem as modified at 909.

At 912, detailed placement and legalization is performed on the locations of the cells to generate a final placement solution for the cells.

Figure 10:
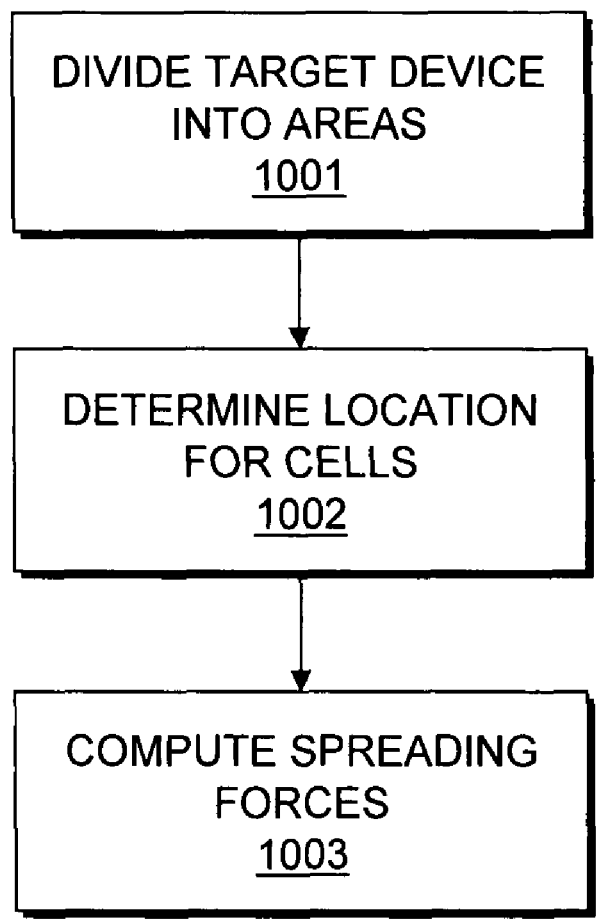
FIG. 10 illustrates a method for performing partitioning according to an embodiment of the present invention.

FIG. 10 illustrates a method for performing partitioning according to an embodiment of the present invention. The procedure illustrated in FIG. 10 may be used to perform 903 shown in FIG. 9. At 1001, the target device is divided into areas. This sizing of areas or regions is specific to each cell classification type and performed with consideration of restrictive areas associated with the cell classification type. Each area may be sized to tightly enclose the areas into which cells of the classification type can be placed. When partitioning, especially for capacity-legalization with minimum movement, precise determinations are not typically made for where, within an area, cells assigned to that area will be placed. Consequently, general assumptions are made that the element will end up near the center of the area or near the closest or most-favorable corner of the area. In order to minimize the error of these assumptions because of the restrictive areas, making an area tightly enclose a relevant area can be advantageous. According to an embodiment of the present invention, an area will be the smallest rectangle that still encloses all the relevant areas.

Another aspect of dividing a target device into areas is how to divide up a placement area on the target device into the areas. Whether the placement area is an entire chip, or a portion of the entire chip, how the placement area is divided can affect the quality of the partitioning. In situations where there are no restrictive areas and cells may be placed uniformly over the placement area, areas may be divided by simply bisecting or quadrisecting the placement area. However, when restrictive areas are present, it may be advantageous to divide up the placement area such that each of the areas allows reasonably good ubiquitous placement of elements within it. This would prevent there being large areas within each area that cannot accommodate the placement of elements of the classification type of interest. Careful choice of areas often involves increasing the number of areas that must be partitioned between and carving areas around obstacles.

Figure 11A:
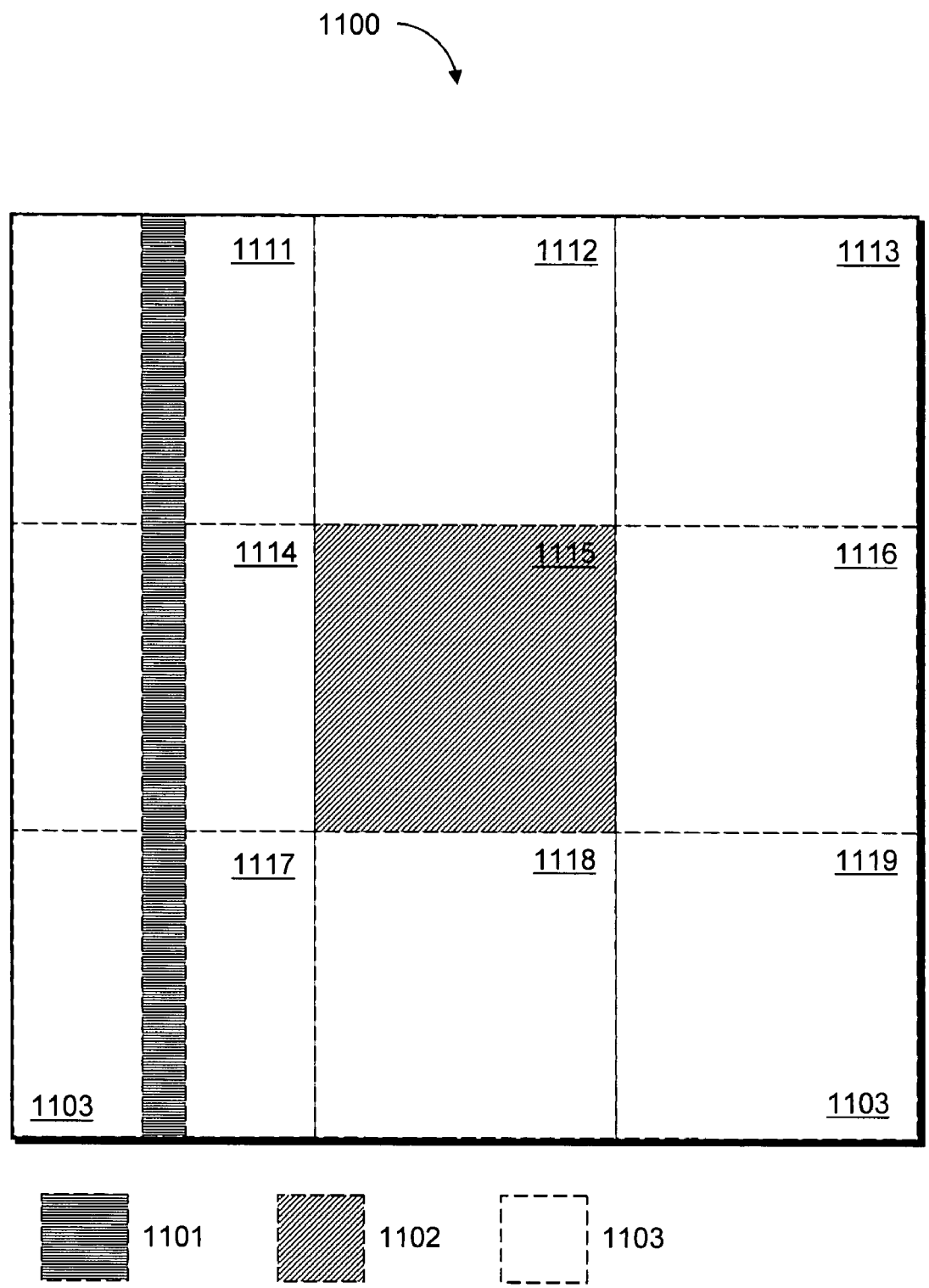
FIGS. 11a and 11b illustrate examples of dividing a target device into a plurality of areas according to embodiments of the present invention.

FIG. 11a illustrates an example of dividing a target device according to a first exemplary embodiment of the present invention. FIG. 11a illustrates a placement area 1100 of a target device that includes regions that support multipliers 1101, memory 1102, and logic-array blocks 1103. According to an embodiment of the present invention where partitioning is performed on cells having a classification type of a logic-array block, the placement area 1100 is divided into 9 sections, labeled 1111-1119. Notice that the section that supports memory does not create a large blockage for logic element placement within any of the areas that accommodate logic-array blocks.

Figure 11B:
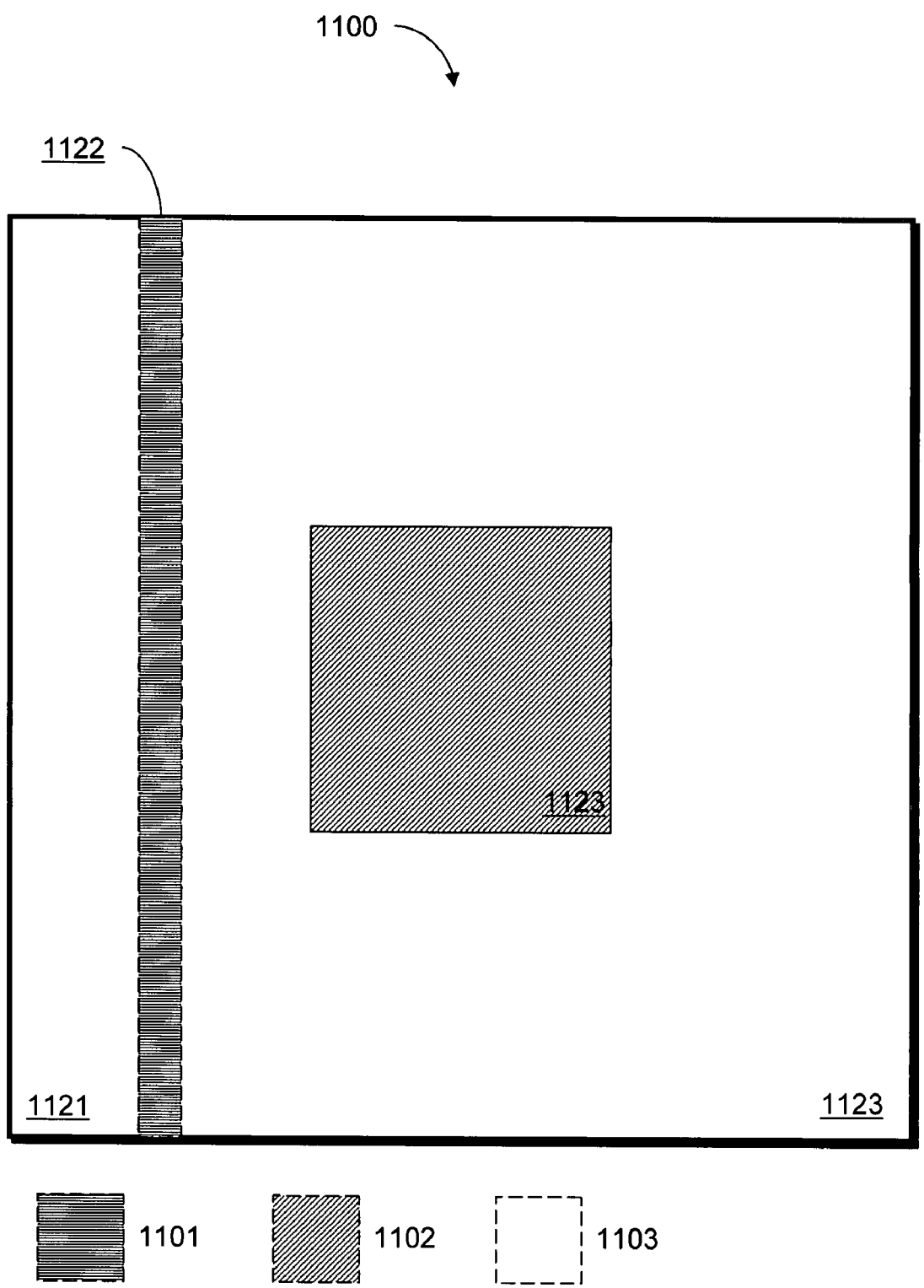

It should be appreciated that the size and shape of the areas in a placement area of the target device may change for each partitioning of a cell classification type. FIG. 11b illustrates an example of dividing a target device according to a second exemplary embodiment of the present invention. According to an embodiment of the present invention where partitioning is performed on cells having a classification type of a multiplier, the placement area 1100 is divided into 3 sections, labeled 1121-1123.

Referring back to FIG. 10, at 1002 locations are determined for the cells of the classification type. Cells are assigned to areas according to their positions after an analytic solution. Cells are assigned to the areas to which they are closest. At this point, some areas may be filled beyond capacity. To find a capacity legal solution, an iterative procedure may be used where in each iteration, a number of cells in an overfilled area is reduced by one and a number of cells in an under-filled area is increased by one. A cell may move either directly from an overfilled area to an under-filled area. Alternatively, a cell may move such as from an overfilled area to an area that is not under-filled, but a cell will be selected from that area to move to an under-filled area. This rippling may occur over several areas until an under-filled area is found. According to an embodiment of the present invention, each area maintains a heap for each other area which indicates a next most promising cell which should be moved into that other area. The cost of moving a cell may be computed from the position of the cell after the last analytic solution, and the closest point in the target area to that position.

According to an embodiment of the present invention, a best-first search procedure may be used where the area with the largest overfill is first selected. The most promising cell to move from the area is selected by considering all the possible destination areas. If the corresponding destination area is under-filled, the search is complete. If the corresponding destination area is not under-filled, the search continues from that area. When performing the search, an area is never visited twice to avoid cycles. According to one embodiment, only moves which move cells to less favorable areas than they are currently in are considered. This avoids undoing previous changes, which may lead to unfavorable move sequences because of the greedy selection process.

According to a second embodiment of the present invention, a recursive alternative procedure may be used to more exhaustively examine alternative move sequences before deciding on one to perform. In sequence, it considers all over-filled areas as the source area for a move sequence. For each over-filled area source, all other areas will be considered, in sequence as destinations with the most promising cell to be moved being a function of the area being considered as a destination. For each of those other areas, if they are not under-filled, recursively, all areas, so far not included in the candidate move sequence, will be considered. This recursive search is used to find the best move sequence that terminates on an under-filled area. To reduce the size of the search, pruning based on the best move sequence found so far may be employed. Also, this search may not consider moves which move elements to more favorable regions than they are currently in because at any given iteration, an assumption can be made that the assignment of cells to areas is fairly good so any seemingly highly favorable move will ultimately yield less favorable move sequences.

The exemplary embodiments described find a "legal" partitioning solution that moves cells a minimum amount. It should be appreciated that alternatively embodiments may try to optimize objectives such as wirelength or weighted net cut during partitioning.

To remedy sub-optimal area assignment due to the capacity-legal partitioning approach, an iterative improvement phase may be employed that will consider element moves between areas while directly optimizing objectives such as timing, wirelength, power, and other criteria. This may be run before a new set of area assignments are imposed. There is no reason to restrict the movement of cells to be limited according to any hierarchy of areas determined during the recursive partitioning. Cells should be allowed to move across many areas, if it is favorable. There may be some advantage, however, using cell hierarchical information to guide the search for promising cell moves. A strictly greedy iterative improvement procedure may be employed rather than a more elaborate one that facilitates hill climbing.

At 1003, spreading forces are computed in response to the locations determined for cells at 1002. According to an embodiment of the present invention, weaker forces are applied to attract cells with more ubiquitous placement options to the respective regions since those cells are given more opportunity to adapt to the movement of cells with fewer placement options. Stronger forces may be applied on cells with less ubiquitous placement options since these cells have fewer placement options.

It should be appreciated that the partitioning procedure illustrated in FIG. 10 may be performed each time procedure 903 is performed. At a first partitioning level, areas may be determined for the target device at 1001. At subsequent partitioning levels, the original areas are further divided into smaller sub-areas at 1001.

FIGS. 1 and 3-10 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 12:
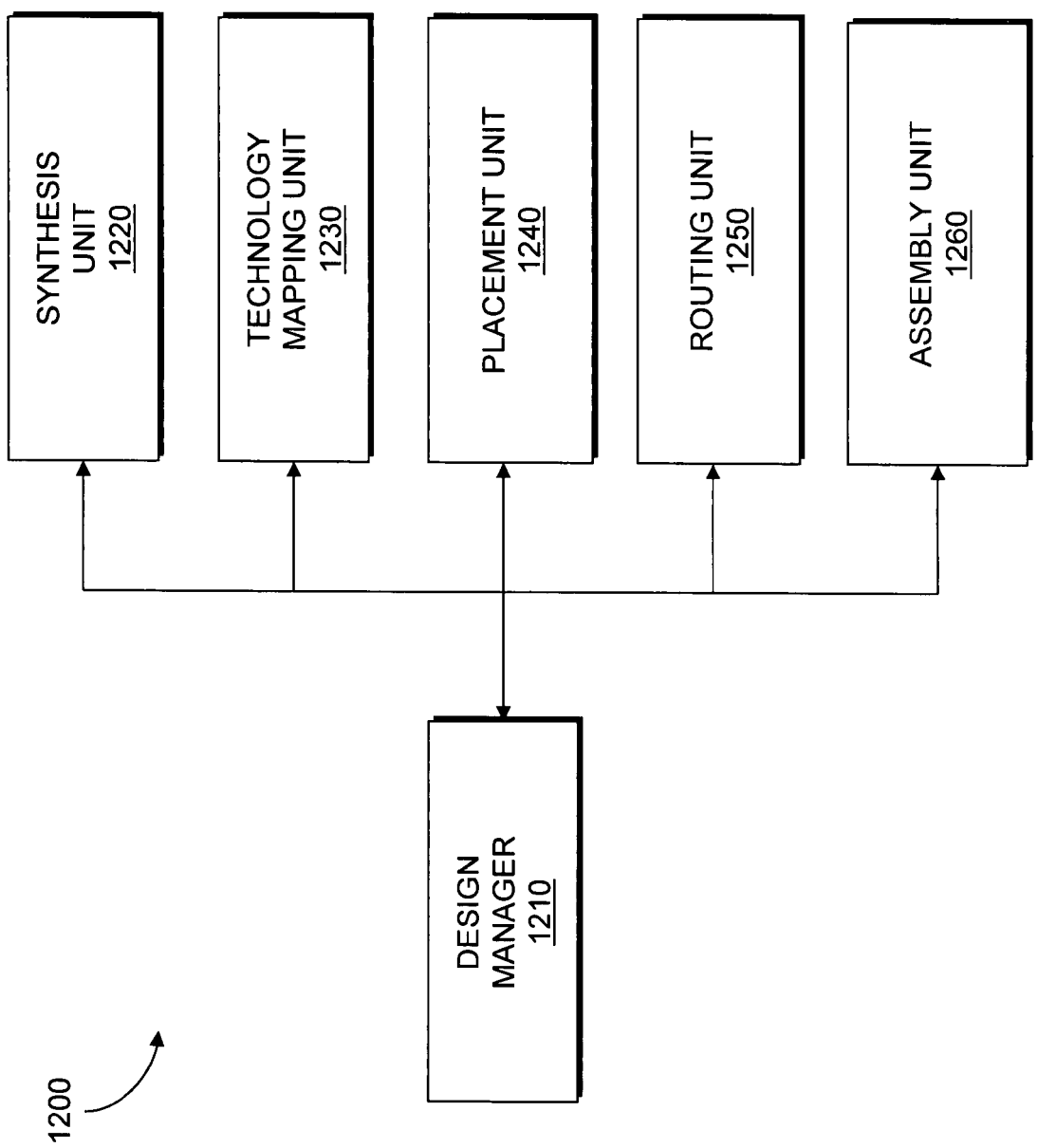
FIG. 12 illustrates a system designer according to an exemplary embodiment of the present invention.

FIG. 12 illustrates a system designer 1200 according to an embodiment of the present invention. The system designer 1200 may be an EDA tool for designing a system on a target device. The target device may be, for example, a structured ASIC, an FPGA, a PLD, or other circuitry. FIG. 12 illustrates software modules implementing an embodiment of the present invention. According to one embodiment, system design may be performed by a computer system executing sequences of instructions represented by the software modules shown in FIG. 12. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 1200 includes a design manager 1210. The design manager 1210 receives a design for a system. The design may be described at a gate level or in a more abstract level. The design may be described in terms of a Hardware Description Language such as VHDL or Verilog. The design manager 1210 is connected to and transmits data between the components of the system designer 1200.

Block 1220 represents a synthesis unit that performs synthesis. The synthesis unit 1220 generates a logic design of a system to be implemented in the target device. According to an embodiment of the system designer 1200, the synthesis unit 1220 takes a conceptual HDL design definition and generates an optimized logical representation of the system. The optimized logical representation of the system generated by the synthesis unit 1220 may include a representation that has a minimized number of functional blocks and registers, such as logic gates and logic elements, required for the system. Alternatively, the optimized logical representation of the system generated by the synthesis unit 1220 may include a representation that has a reduced depth of logic and that generates a lower signal propagation delay.

Block 1230 represents a technology mapping unit that performs technology mapping. The technology mapping unit 1230 determines how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, IO elements or other components.

Block 1240 represents a placement unit that performs placement. The placement unit 1240 processes the optimized technology-mapped netlist to produce a placement for each of the functional blocks. According to an embodiment of the present invention for a target device that is a structured ASIC or FPGA, the placement unit 1240 fits the system on the target device by determining which components on the logic device are to be used for specific logic elements, and other function blocks. According to an embodiment of the present invention, the placement unit applies one or more analytic placement techniques that establish one or more equations to compute a cost (or "energy") for a potential placement. The one or more equations may take into account objectives such as the amount of wire needed to connect together cells, the speed of the resulting design, the amount of power used, or other criteria. The solution which minimizes the "energy" of the system may be used when assigning locations for the cells on the target device. According to an embodiment of the present invention, the one or more equations may reflect restrictive areas on the target device that do not support certain cells. In this embodiment, an equation used for analytic placement may be modified differently for each classification type of cells to be placed. By taking into consideration classification types of cells and the restricted areas on the target device, embodiments of the present invention allow analytic placement techniques to be used to effectively place cells such as logic-array blocks, registers, multipliers, IOs, and memories on target devices such as FPGAs and structured ASICs. The placement unit 1240 may perform the procedures described with reference to FIGS. 3-10.

Block 1250 represents a routing unit that performs routing. The routing unit 1250 determines the routing resources on the target device to use to provide interconnection between the components implementing functional blocks and registers of the logic design.

Block 1260 represents an assembly unit that performs an assembly procedure that creates a data file that includes the design of the system generated by the system designer 1200. The data file may be a bit stream that may be used to program the target device. The assembly unit 1260 may output the data file so that the data file may be stored or alternatively transmitted to a separate machine and used to program the target device. It should be appreciated that the assembly unit 1260 may also output the design of the system in other forms such as on a display device or other medium.

Figure 13:
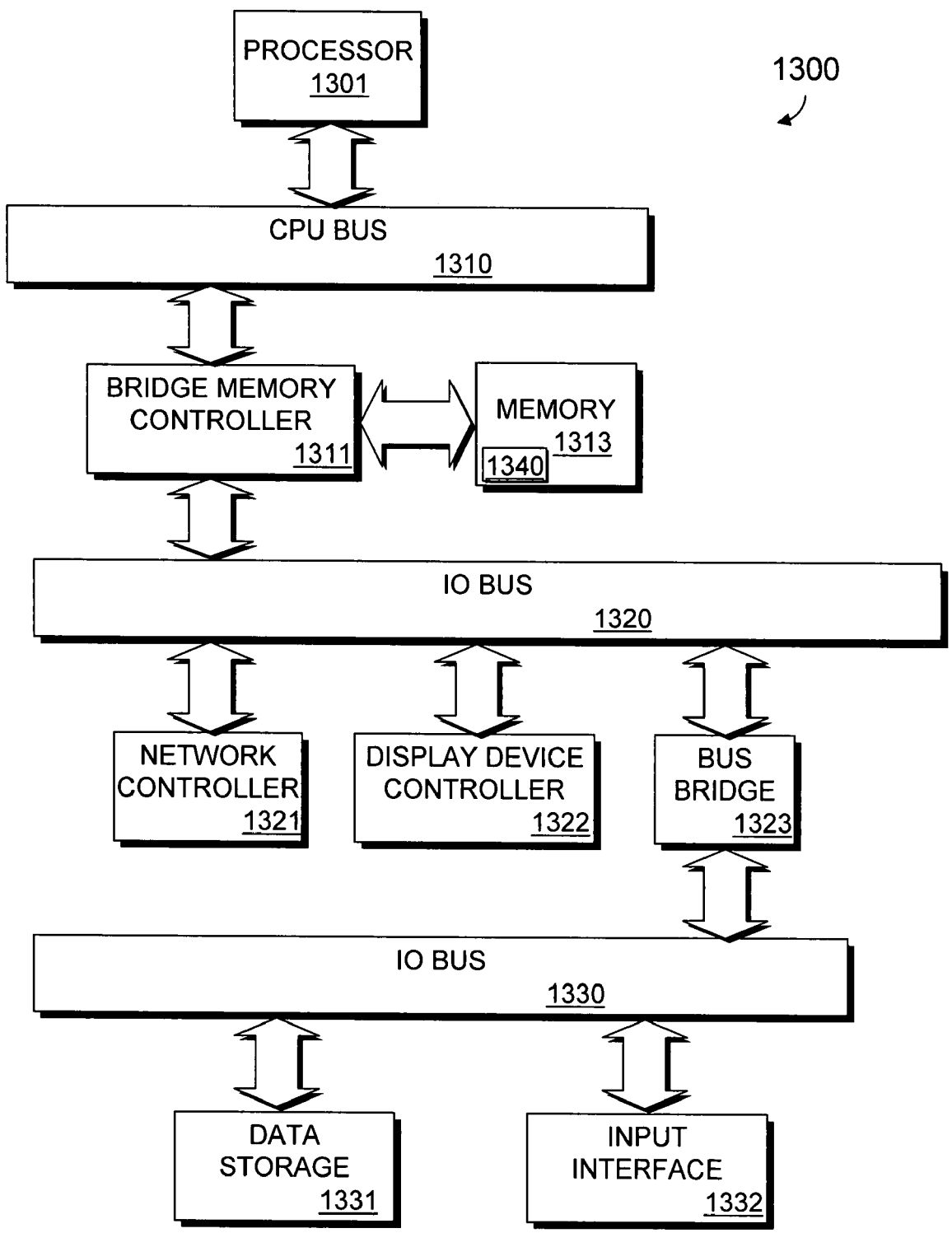
FIG. 13 illustrates an exemplary computer system used to implement the system designer according to an embodiment of the present invention.

FIG. 13 is a block diagram of an exemplary computer system 1300 in which an example embodiment of the present invention resides. The computer system 1300 may be used to implement the system designer 900 shown in FIG. 9. The computer system 1300 includes a processor 1301 that processes data signals. The processor 1301 is coupled to a CPU bus 1310 that transmits data signals between other components in the computer system 1300.

The computer system 1300 includes a memory 1313. The memory 1313 may be a dynamic random access memory device, a static random access memory device, and/or other memory device. The memory 1313 may store instructions and code represented by data signals that may be executed by the processor 1301. A bridge memory controller 1311 is coupled to the CPU bus 1310 and the memory 1313. The bridge memory controller 1311 directs data signals between the processor 1301, the memory 1313, and other components in the computer system 1300 and bridges the data signals between the CPU bus 1310, the memory 1313, and a first IO bus 1320.

The first IO bus 1320 may be a single bus or a combination of multiple buses. The first IO bus 1320 provides communication links between components in the computer system 1300. A network controller 1321 is coupled to the first IO bus 1320. The network controller 1321 may link the computer system 1300 to a network of computers (not shown) and supports communication among the machines. A display device controller 1322 is coupled to the first IO bus 1320. The display device controller 1322 allows coupling of a display device (not shown) to the computer system 1300 and acts as an interface between the display device and the computer system 1300.

A second IO bus 1330 may be a single bus or a combination of multiple buses. The second IO bus 1330 provides communication links between components in the computer system 1300. A data storage device 1331 is coupled to the second IO bus 1330. The data storage device 1331 may be a hard disk drive, a floppy disk drive, a CD-ROM device, a flash memory device or other mass storage device. An input interface 1332 is coupled to the second IO bus 1330. The input interface 1332 may be, for example, a keyboard and/or mouse controller or other input interface. The input interface 1332 may be a dedicated device or can reside in another device such as a bus controller or other controller. The input interface 1332 allows coupling of an input device to the computer system 1300 and transmits data signals from an input device to the computer system 1300. A bus bridge 1323 couples the first IO bus 1320 to the second IO bus 1330. The bus bridge 1323 operates to buffer and bridge data signals between the first IO bus 1320 and the second IO bus 1330. It should be appreciated that computer systems having a different architecture may also be used to implement the computer system 1300.

A system designer 1340 may reside in memory 1313 and be executed by the processor 1301. The system designer 1340 may operate to synthesize a system, place the system on a target device, route the system, and perform physical synthesis for the system, where different optimization strategies are performed in parallel on a single netlist utilizing the plurality of threads supported by the processor 1301.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device having restricted areas, comprising:

determining locations on the target device for all cells in the system by solving one or more equations computing spreading forces by dividing the target device into a plurality of areas and computing a capacity for at least one area for a classification type of the cell;

performing at least one of modifying or adding to the one or more equations by applying spreading forces to the cells that take into consideration one or more classification types of the cells and restricted areas on the target device that do not support the classification types; and determining revised locations on the target device for the cells by solving the modified or added to one or more equations, wherein at least one of the determining and performing procedures are performed by a computer.

2. The method of claim 1, further comprising:

determining whether the revised locations for the cells are satisfactory;

further modifying the one or more equation by applying new spreading forces to the cells that take into consideration classification types of the cells and restricted areas on the target device that do not support the classification types; and determining new locations for the cells by solving the modified equations.

3. The method of claim 2, wherein determining whether the revised locations for the cells are satisfactory comprises determining a degree of overlap of the cells on the target device.

4. The method of claim 2, wherein determining whether the revised locations for the cells are satisfactory comprises determining whether the cells are legally placed in locations that support their classification type.

5. The method of claim 1, further comprising computing a spreading force for a cell.

6. The method of claim 1, wherein computing the spreading forces for a cell further comprises:
   computing an occupancy for at least one area for the classification type of the cell; and
   computing a cell vector for the cell based on the capacities and occupancies.

7. The method of claim 6, wherein computing the cell vector for the cell comprises:
   computing an area to cell vector for each of two or more areas that reflect how each of the areas can support the cell; and
   summing a plurality of area to cell vectors to form the cell vector.

8. The method of claim 7, wherein computing the area to cell vector comprises:
   generating a vector from an area to the cell; and
   setting the magnitude of the vector to be an occupancy of the area for the classification type of the cell divided by a square of a distance from the cell to the area.

9. The method of claim 7, wherein computing the area to cell vector comprises:
   generating a vector from an area to the cell; and
   setting a magnitude of the vector to be a function of an occupancy and a capacity of the area.

10. The method of claim 9, wherein computing the area to cell vector comprises:
    generating a vector from an area to the cell; and
    setting the magnitude of the vector to be one of a difference and ratio of an occupancy of the area for the classification type of the cell and a capacity of the area for the classification type of the cell divided by a square of a distance from the cell to the area.

11. The method of claim 1, further comprising:
    shifting one or more cells to reduce cell overlap; and
    computing the spreading forces for the one or more cells to reflect the shifting.

12. The method of claim 11, wherein shifting the one or more cells comprises:
    creating a compressed floor plan of the target device for each classification type of the cells that supports a classification type of the cells where the compressed floor plan is divided into a plurality of rows and columns of areas;
    computing a capacity for each of the plurality of areas for a classification type of the cells for each compressed floor plan;
    computing an occupancy for each of the plurality of areas for the classification type of the cells for each compressed floor plan;
    determining how cells should be redistributed based upon at least one of occupancy and capacity of the areas for each compressed floor plan; and
    mapping new cell locations back to a floor plan of the target device from each compressed floor plan.

13. The method of claim 11, wherein shifting the one or more cells comprises:
    creating a compressed floor plan of the target device for each classification type of the cells that supports a classification type of the cells where the compressed floor plan is divided into a plurality of rows and columns of areas;
    computing a capacity for each of the plurality of areas for a classification type of the cells; and
    computing an occupancy for each of the plurality of areas for the classification type of the cells;
    determining how cells should be redistributed between a pair of adjacent areas in either a row or a column based upon one of occupancy and capacity of the adjacent areas; and
    mapping new cell locations back to a floor plan of the target device from each compressed floor plan.

14. The method of claim 13, wherein determining how cells should be redistributed between the pair of adjacent areas comprises:
    computing a desired size for each area based upon capacity and occupancy of each area;
    modify the desired size for each area by normalizing the desired size for each area; and
    computing a new placement for cells in adjacent areas.

15. The method of claim 11, wherein shifting the one or more cells comprises:
    creating a compressed floor plan of the target device for each classification type of the cells that supports a classification type of the cells where the compressed floor plan is divided into a plurality of areas in rows and columns;
    computing a capacity for each of the plurality of areas for a classification type of the cells for each compressed floor plan;
    computing an occupancy for each of the plurality of areas for the classification type of the cells for each compressed floor plan;
    determining how cells should be redistributed based upon occupancy and/or capacity of the areas in either a row or a column; and
    mapping new cell locations back to the target device from each compressed floor plan.

16. The method of claim 15, wherein determining how cells should be redistributed between areas in either a row or a column comprises:
    computing a desired size for each area in a row or column based upon capacity and occupancy of each area;
    modify the desired size for each area in a row or column by normalizing the desired size for each area; and
    computing a new placement for cells in each row or column.

17. The method of claim 1, further comprising outputting a data file that includes the new locations for the cells.

18. The method of claim 17, further comprising configuring the target device with the data file using a computer system.

19. The method of claim 1, wherein the one or more equations reflect spreading forces which are a function of local information of areas close to the cells.

20. The method of claim 11, wherein shifting the one or more cells comprises:
    computing a capacity for each of the plurality of areas for a classification type of the cells;
    computing an occupancy for each of the plurality of areas for the classification type of the cells; and determining how cells should be redistributed based upon at least one of occupancy and capacity of the areas.

21. The method of claim 11, wherein shifting the one or more cells comprises:
   computing a capacity for each of the plurality of areas for a classification type of the cells;
   computing an occupancy for each of the plurality of areas for the classification type of the cells; and
   determining how cells should be redistributed based upon occupancy and/or capacity of the areas in either a row or a column.

22. The method of claim 1, wherein the target device is a FPGA.

23. The method of claim 1, wherein the target device is a structured ASIC.

24. An article of manufacture comprising a machine accessible medium including sequences of instructions, the sequences of instructions including instructions which when executed cause the machine to perform:
   determining locations on a target device having restricted areas for all cells in the system by solving one or more equations computing spreading forces by dividing the target device into a plurality of areas and computing a capacity for at least one area for a classification type of the cell;
   performing at least one of modifying or adding to the one or more equations by applying spreading forces to the cells that take into consideration one or more classification types of the cells and restricted areas on the target device that do not support the classification types; and
   determining revised locations on the target device for the cells by solving the modified or added to one or more equations.

25. The article of manufacture of claim 24, further comprising instructions which when executed performs:
   computing an occupancy for at least one area for the classification type of the cell; and
   computing a cell vector for the cell based on the capacities and occupancies.

26. A method for designing a system on a target device having restricted areas, comprising:
   determining locations on the target device for cells in the system by solving one or more equations computing spreading forces by dividing the target device into a plurality of areas and computing a capacity for at least one area for a classification type of the cell;
   performing at least one of modifying or adding to the one or more equations by applying first spreading forces to a first plurality of cells of a first classification type and second spreading forces to a second plurality of cells of a second classification type, wherein the first and second spreading forces take into consideration the first and second classification types and restricted areas on the target device that do not support the first and second classification types; and
   determining revised locations on the target device for the cells by solving the modified or added to one or more equations, wherein at least one of the determining and performing procedures are performed by a computer.

27. The method of claim 26, wherein the first and second spreading forces are applied in parallel to the first plurality of cells of the first classification type and the second plurality of cells of the second classification type.

28. The method of claim 26, wherein the first plurality of cells of the first classification type are one of logic array blocks, registers, multipliers, memories, and input outputs and the second plurality of cells of the second classification type are of a component type different than the first classification type.

29. The method of claim 26, wherein the first plurality of cells of the first classification type are logic-array blocks and the second plurality of cells of the second classification type are components other than logic-array blocks.

30. The method of claim 26, wherein the first plurality of cells of the first classification type are registers and the second plurality of cells of the second classification type are components other than registers.

31. The method of claim 6, wherein the first plurality of cells of the first classification type are multipliers and the second plurality of cells of the second classification type are components other than multipliers.

32. The method of claim 26, wherein the first plurality of cells of the first classification type are memories and the second plurality of cells of the second classification type are components other than memories.

33. The method of claim 26, wherein the first plurality of cells of the first classification type are input outputs (IOs) and the second plurality of cells of the second classification type are components other than IOs.

34. The method of claim 26, wherein computing the spreading forces further comprises:
   computing an occupancy for at least one area for the classification type of the cell; and
   computing a cell vector for the cell based on the capacities and occupancies.

* * * * *